(12) United States Patent
Kawabe et al.

(10) Patent No.: US 11,588,343 B2
(45) Date of Patent: Feb. 21, 2023

(54) POWER STORAGE DEVICE, POWER STORAGE SYSTEM, POWER SUPPLY SYSTEM, AND CONTROL METHOD FOR POWER STORAGE DEVICE

(71) Applicant: KANEKA CORPORATION, Osaka (JP)

(72) Inventors: Masaru Kawabe, Osaka (JP); Takashi Matsuda, Osaka (JP); Yukinari Sato, Osaka (JP)

(73) Assignee: KANEKA CORPORATION, Osaka (JP)

( * ) Notice: Subject to any disclaimer, the term of this patent is extended or adjusted under 35 U.S.C. 154(b) by 452 days.

(21) Appl. No.: 16/921,482

(22) Filed: Jul. 6, 2020

(65) Prior Publication Data

US 2020/0335998 A1 Oct. 22, 2020

Related U.S. Application Data

(63) Continuation of application No. PCT/JP2018/033791, filed on Sep. 12, 2018.

(30) Foreign Application Priority Data

Jan. 5, 2018 (JP) .............................. JP2018-000450
Feb. 23, 2018 (JP) .............................. JP2018-031168

(51) Int. Cl.
*H02J 7/00* (2006.01)
(52) U.S. Cl.
CPC ...... *H02J 7/007194* (2020.01); *H02J 7/0047* (2013.01); *H02J 7/0068* (2013.01)
(58) Field of Classification Search
CPC ... H02J 7/007194; H02J 7/0047; H02J 7/0068
(Continued)

(56) References Cited

U.S. PATENT DOCUMENTS

| 10,514,423 | B2* | 12/2019 | Shiraishi | ............ G01R 31/367 |
| 2012/0105014 | A1* | 5/2012 | Nakayama | ........... G01R 31/367 |
| | | | | 702/63 |
| 2014/0021924 | A1* | 1/2014 | Abe | ..................... H01M 10/48 |
| | | | | 320/118 |

FOREIGN PATENT DOCUMENTS

EP 1892813 A2 2/2008
JP 2014-119394 A 6/2014
(Continued)

OTHER PUBLICATIONS

International Search Report issued in International Application No. PCT/JP2018/033791, dated Oct. 16, 2018 (5 pages).
(Continued)

*Primary Examiner* — Nathaniel R Pelton
(74) *Attorney, Agent, or Firm* — Osha Bergman Watanabe & Burton LLP

(57) ABSTRACT

A power storage device includes: a cell; and a controller that: causes the cell to discharge from a full charge capacity to a set capacity that is set in advance, and executes a full charge capacity correction mode including a remaining capacity calculation operation and capacity consumption calculation operation. In the remaining capacity calculation operation, the controller: acquires a first voltage of the cell at the set capacity in response to the cell discharging from the full charge capacity to the set capacity, and calculates an actual remaining capacity of the cell based on the first voltage and one of a plurality of correlations between a voltage of the cell and a cell capacity.

11 Claims, 6 Drawing Sheets

(58) Field of Classification Search
USPC .......................................................... 320/134
See application file for complete search history.

(56) References Cited

FOREIGN PATENT DOCUMENTS

| | | |
|---|---|---|
| JP | 2015-059816 A | 3/2015 |
| JP | 2016-025760 A | 2/2016 |
| JP | 2017-125699 A | 7/2017 |
| WO | 2012/165629 A1 | 12/2012 |

OTHER PUBLICATIONS

Written Opinion issued in International Application No. PCT/JP2018/033791, dated Oct. 16, 2018 (6 pages).

* cited by examiner

POWER STORAGE DEVICE, POWER STORAGE SYSTEM, POWER SUPPLY SYSTEM, AND CONTROL METHOD FOR POWER STORAGE DEVICE

TECHNICAL FIELD

The present invention relates to a power storage device, a power storage system, and a power supply system. Particularly, the present invention relates to a stationary power storage device.

BACKGROUND

In recent years, a power supply system including a power generation device and a power storage device in addition to a system power supply and being capable of supplying power generated by the power supply system itself to an external load has been developed. This power supply system is arranged in parallel with the system power supply, charges the power storage device with power supplied from the system power supply during the night during which an electric rate is low, and the charged power is supplied from the power storage device to the external load such as a home appliance during the day. This can lead to reduction in an electric bill.

Moreover, the power storage device configured to store the power includes a built-in secondary cell group configured such that multiple secondary cells are connected to each other in series. Since the multiple secondary cells are connected to each other in series, voltage is increased so that greater power can be charged/discharged.

Due to long-time use, a material forming the secondary cell built in the power storage device is deteriorated, and a cell capacity thereof is decreased. When such a cell capacity decrease occurs, a difference between an actual full charge capacity and a full charge capacity upon shipment is caused. In this case, an error is caused in an indication of the capacity monitored by a user, or charging or discharging is not performed according to the actual full charge capacity. In some cases, there is a probability that over-discharging or over-charging occurs. When over-discharging or over-charging occurs, deterioration of the material forming the secondary cell is accelerated and the life of the secondary cell is shortened. Particularly, in the power storage device including the built-in secondary cell group configured such that the multiple secondary cells are connected to each other in series, there is an individual difference among the secondary cells of the secondary cell group. For this reason, over-discharging or over-charging easily occurs in a small-capacity secondary cell.

PATENT DOCUMENT

PATENT DOCUMENT 1: Japanese Unexamined Patent Publication No. 2016-25760

SUMMARY

One or more embodiments of the present invention provide a power storage device, a power storage system, a power supply system, and a power storage device control method so that a full charge capacity can be set according to an actual full charge capacity.

A power storage device according to one or more embodiments of the present invention includes a cell and a controller configured to control charging/discharging of the cell.

The controller causes the cell to perform discharging from a full charge capacity to a set capacity set in advance, and executes a full charge capacity correction mode.

The full charge capacity correction mode executes (or includes) the remaining capacity calculation operation of acquiring, in the case of performing discharging from the full charge capacity to the set capacity by the cell, a first voltage of the cell at the set capacity to calculate an actual remaining capacity of the cell based on the first voltage and a preset correlation between the voltage of the cell and a cell capacity, and the capacity consumption calculation operation of accumulating a current value upon discharging from the full charge capacity to the set capacity to calculate a capacity consumption consumed from the full charge capacity to the set capacity. In the full charge capacity correction mode, the sum of the actual remaining capacity and the capacity consumption is re-set as the full charge capacity.

The correlation between the voltage of the cell and the cell capacity is set in advance as multiple correlations for different environmental temperatures, and the remaining capacity calculation operation is executed using one of the multiple correlations close to an actual environmental temperature.

The "current value" described herein includes not only a positive value but also a negative value. For example, when a current amount by discharging is +i [A], a current amount by charging is −i [A].

The "full charge capacity" described herein is a charge capacity in a state taken as a full charge state according to predetermined criteria.

The "first voltage" at the "set capacity" means the voltage of the entirety or part of the cell at the set capacity. That is, the "first voltage" at the "set capacity" means the voltage of the entirety of the cell in a case where the cell includes a single cell, and includes not only the voltage of the entirety of the cell but also the voltage of each cell or a group in a case where the cell includes multiple cells.

According to one or more embodiments of the present invention, the full charge capacity correction mode separately performs (or includes) the remaining capacity calculation operation of calculating the actual remaining capacity and the capacity consumption calculation operation of calculating the capacity consumption on condition that the cell has performed discharging from the full charge capacity to the set capacity, and sums calculation results of the remaining capacity calculation operation and the capacity consumption calculation operation to set the resultant as an actual full charge capacity. That is, in the remaining capacity calculation operation, the remaining capacity as an actual charge capacity is calculated utilizing the preset correlation between the voltage of the cell and the cell capacity. Further, in the capacity consumption calculation operation, the current of the cell is accumulated to calculate the capacity consumption from a different point of view from that of the remaining capacity calculation operation. In this manner, the full charge capacity is set. Thus, the actual full charge capacity can be reset according to a decrease in the capacity of the cell due to deterioration of the cell, and control can be performed accordingly. Consequently, over-discharging or over-charging can be prevented.

In addition, the correlation between the voltage of the cell and the cell capacity is set in advance as the multiple correlations for the different environmental temperatures, and in the remaining capacity calculation operation, the actual remaining capacity is calculated using the correlation close to the actual environmental temperature. Thus, the actual full charge capacity can be accurately reset according to a change in the environmental temperature.

According to one or more embodiments of the present invention, the full charge capacity can be set according to the actual full charge capacity.

DETAILED DESCRIPTION

Hereinafter, one or more embodiments of the present invention will be described in detail based on the drawings. Note that the present invention is not limited to the following embodiments. Moreover, change can be made as necessary without departing from a scope providing advantageous effects of the present invention.

A power supply system 1 according to one or more embodiments of the present invention is mainly provided at an architectural structure such as a house or a building and forming a power supply of an external load 100 such as electronic equipment. That is, the power supply system 1 is a stationary power supply system fixed at a desired position upon use.

Figure 1:
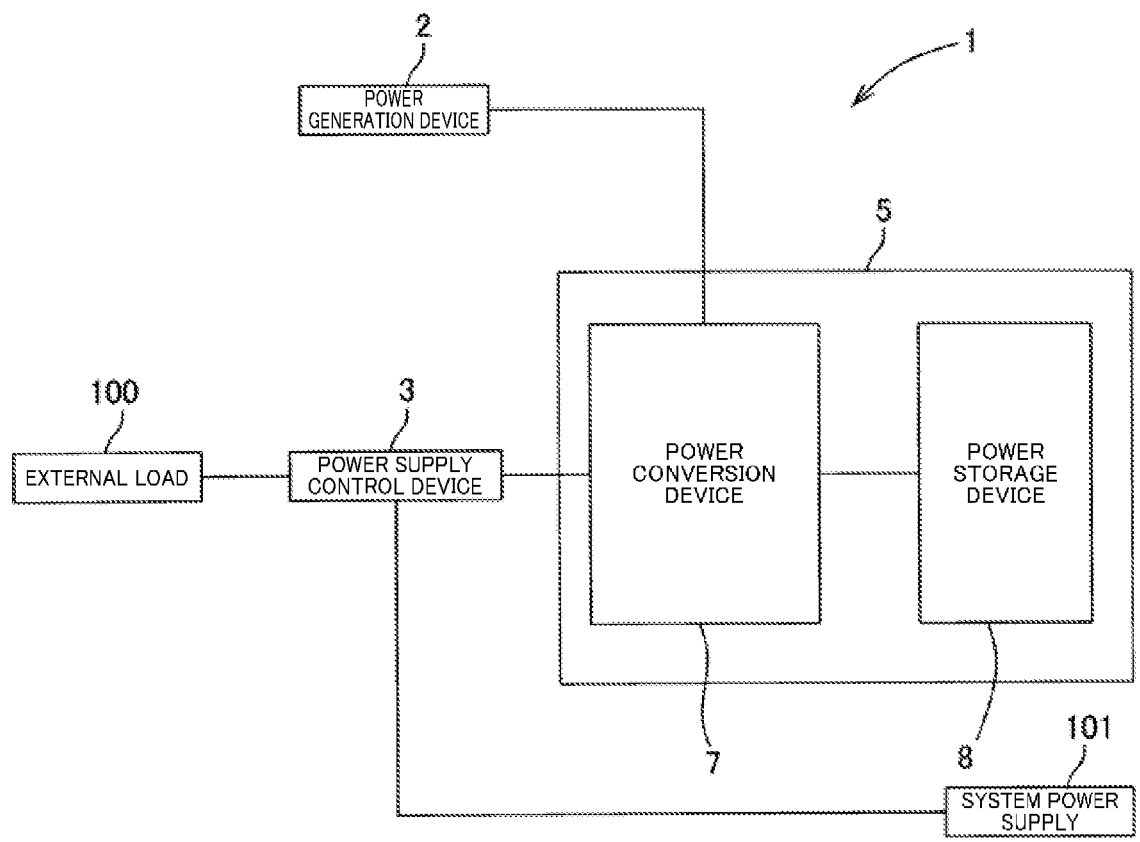
FIG. 1 is a block diagram illustrating a power supply system according to one or more embodiments of the present invention.

As illustrated in FIG. 1, the power supply system 1 includes a power generation device 2, a power supply control device 3, a not-shown display device, and a power storage system 5. In the power supply system 1, the external load 100 and a system power supply 101 are connected to the power supply control device 3, and therefore, power supplied from the system power supply 101 as commercial power supplied from, e.g., an electric power company or power supplied from a power switching device is supplied to the external load 100.

The power generation device 2 is a power generation device such as a solar cell module or a fuel cell module.

The power supply control device 3 is a device capable of switching a power supply for the external load 100 between the system power supply 101 and the power storage system 5.

The display device (not shown) is a device configured to display information regarding the power of the power generation device 2 and the power of a power storage device 8, and can display, e.g., the currents/voltages/powers and power storage amounts of the power generation device 2 and the power storage device 8.

As illustrated in FIG. 1, the power storage system 5 includes a power conversion device 7 and the power storage device 8.

The power conversion device 7 is a so-called power conditioner, and can perform conversion between AC power and DC power. That is, the power conversion device 7 can convert the DC power generated by the power generation device 2 into the AC power to supply the AC power to the power supply control device 3, and can convert the AC power supplied from the system power supply 101 into the DC power to supply the DC power to the power storage device 8.

The power storage device 8 is configured to temporarily store the power generated by the power generation device 2 and the power supplied from the system power supply 101.

Figure 2:
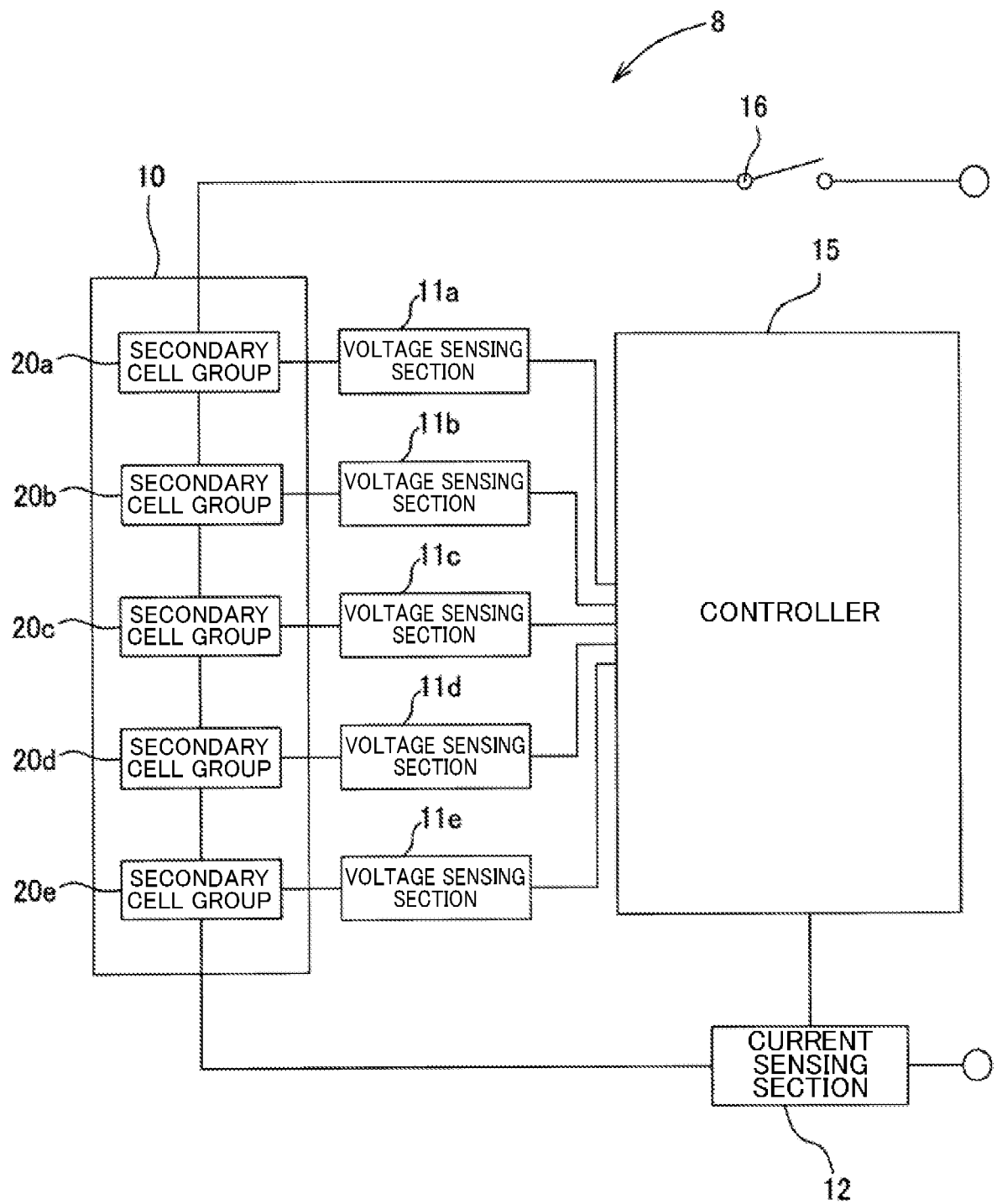
FIG. 2 is a block diagram of a power storage device in one or more embodiments of the present invention.

As illustrated in FIG. 2, the power storage device 8 includes a secondary cell unit 10 (a cell), a voltage sensing section (not shown) configured to sense the voltage of the secondary cell unit 10, multiple voltage sensing sections 11a to 11e (a voltage information sensing section), a current sensing section 12, a controller 15, and a switch 16.

The secondary cell unit 10 is configured such that multiple secondary cell groups 20a to 20e are electrically connected to each other in series. The secondary cell unit 10 according to one or more embodiments includes five secondary cell groups 20a to 20e, as illustrated in FIG. 2.

Each of the secondary cell groups 20a to 20e is configured such that multiple secondary cells (not shown) are electrically connected to each other in parallel.

Note that in this example, each of the secondary cell groups 20a to 20e is configured such that the multiple secondary cells are electrically connected to each other in parallel, but may include a single secondary cell. In this case, the secondary cell unit 10 is configured such that five individual secondary cells are connected to each other in series.

The voltage sensing sections 11a to 11e are sections each provided corresponding to the secondary cell groups 20a to 20e and configured to sense the voltages of the secondary cell groups 20a to 20e. That is, the voltage sensing sections 11a to 11e can independently sense the voltages of the secondary cell groups 20a to 20e.

The current sensing section 12 is a device configured to sense the charge/discharge current of the secondary cell unit 10, and is also a device configured to sense a total current amount passing through the secondary cell unit 10.

The current sensing section 12 according to one or more embodiments senses a discharge current as positive and a charge current as negative. That is, the current sensing section 12 senses "+1 A" when a discharge current of 1 A flows, and senses "−1 A" when a charge current of 1 A flows.

The controller 15 is a charge/discharge control device configured to control charging/discharging of the secondary cell unit 10, and is a remaining capacity management device configured to manage the remaining capacity of the secondary cell unit 10.

The controller 15 is also an arithmetic device connected to each of the voltage sensing sections 11a to 11e and the current sensing section 12 with or without a wire so that predetermined arithmetic processing can be executed based on information sensed by each of the voltage sensing sections 11a to 11e and the current sensing section 12.

Further, the controller 15 is also a current amount accumulator capable of performing the accumulation processing of accumulating a current value sensed by the current sensing section 12.

Specifically, the controller 15 includes, for example, a CPU (a central processing unit) configured to perform various types of arithmetic processing.

The switch 16 is a switch configured to switch between electrical connection and disconnection for the power conversion device 7.

The power storage device 8 is capable of performing a normal operation mode for performing the charge operation of charging the power generated by the power generation device 2 and the power from the system power supply 101 and the discharge operation of discharging the stored power to an external load 100 side.

This normal operation mode is set not to reach equal to or lower than a preset cell capacity in the discharge operation and not to reach equal to or higher than a preset voltage in the charge operation.

Moreover, in addition to the normal operation mode, the power storage device 8 can repeatedly execute, when a predetermined condition is satisfied, a full charge capacity correction mode for re-setting an actual full charge capacity (hereinafter also referred to as "FCC") based on a decrease in the capacity of each secondary cell of the secondary cell groups 20a to 20e due to, e.g., a temporal change.

As described above, the full charge capacity correction mode is a correction mode to which transition is made in the case of satisfying the predetermined condition in a state in which the power storage device 8 is operated in the normal operation mode.

Figure 3:
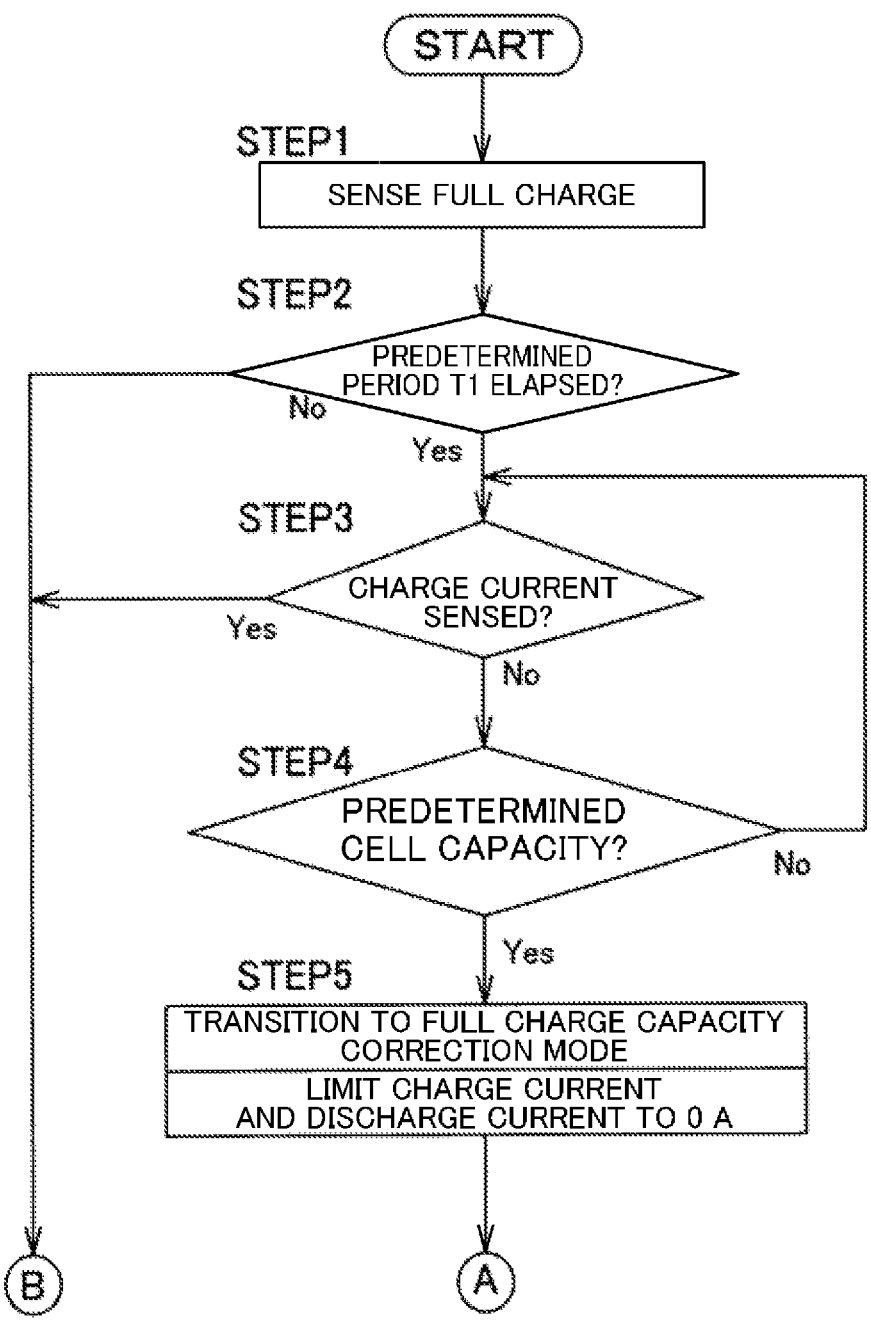
FIG. 3 is a flowchart until transition to a full charge capacity correction mode from a normal operation mode of the power storage device.

Specifically, the full charge capacity correction mode transitions as follows based on a flowchart of FIG. 3.

That is, when the power storage device 8 is operated in the normal operation mode and the secondary cell unit 10 is brought into a full charge state by charging (STEP 1, a full charge sensing step), it is determined whether or not a predetermined period T1 has elapsed after initial start-up or the previous full charge capacity correction mode (STEP 2).

In one or more embodiments described herein, sensing is, as the method for sensing the full charge state, performed upon satisfaction of either one of the following two criteria.

Specifically, the first one is that the full charge state is sensed when the maximum voltage Vmax among the secondary cell groups 20a to 20e forming the secondary cell unit 10 reaches a predetermined voltage. The second one is that the full charge state is sensed when the total voltage of the secondary cell groups 20a to 20e reaches a predetermined voltage. Each "predetermined voltage" is a voltage corresponding to a predetermined charge rate set in advance, and is a voltage as a charge threshold. Needless to say, these values are different from each other.

Moreover, the "predetermined period T1" is a period assumed that a certain degree of change has occurred in the full charge capacity of the secondary cell unit 10, and it is assumed that such a period is, for example, a period of equal to or longer than about 20 days and equal to or shorter than about 90 days.

Note that when discharging is, based on a power request from the external load 100, performed until reaching a predetermined cell capacity (hereinafter also referred to as a "set capacity") set in advance on the external load 100 side, the voltage sensing sections 11a to 11e and the current sensing section 12 monitor the voltage applied to the secondary cell unit 10 and the current passing through the secondary cell unit 10.

The set capacity described herein may be equal to or higher than 10% and equal to or less than 50% of an initially-set full charge capacity or a full charge capacity set in the previous full charge capacity correction mode, and may be equal to or higher than 20% and equal to or lower than 40%. That is, a charge rate (hereinafter also referred to as "SOC") as the ratio of the amount of charged electricity may be set to equal to or higher than 10% and equal to or lower than 50%, and may be equal to or higher than 20% and equal to or lower than 40%.

Then, when the predetermined period T1 has elapsed after the initial start-up or the previous full charge capacity correction mode (Yes at STEP 2), no charge current is sensed until the set capacity set in advance (No at STEP 3), and it is sensed that discharging was performed until the set capacity (Yes at STEP 4, a discharge end sensing step), transition to the full charge capacity correction mode is made, and the charge current and the discharge current are substantially limited to 0 A (STEP 5). That is, current input/output of the power storage device 8 to/from the outside is substantially brought into 0 A, and a pseudo open circuit state is formed.

Figure 4:
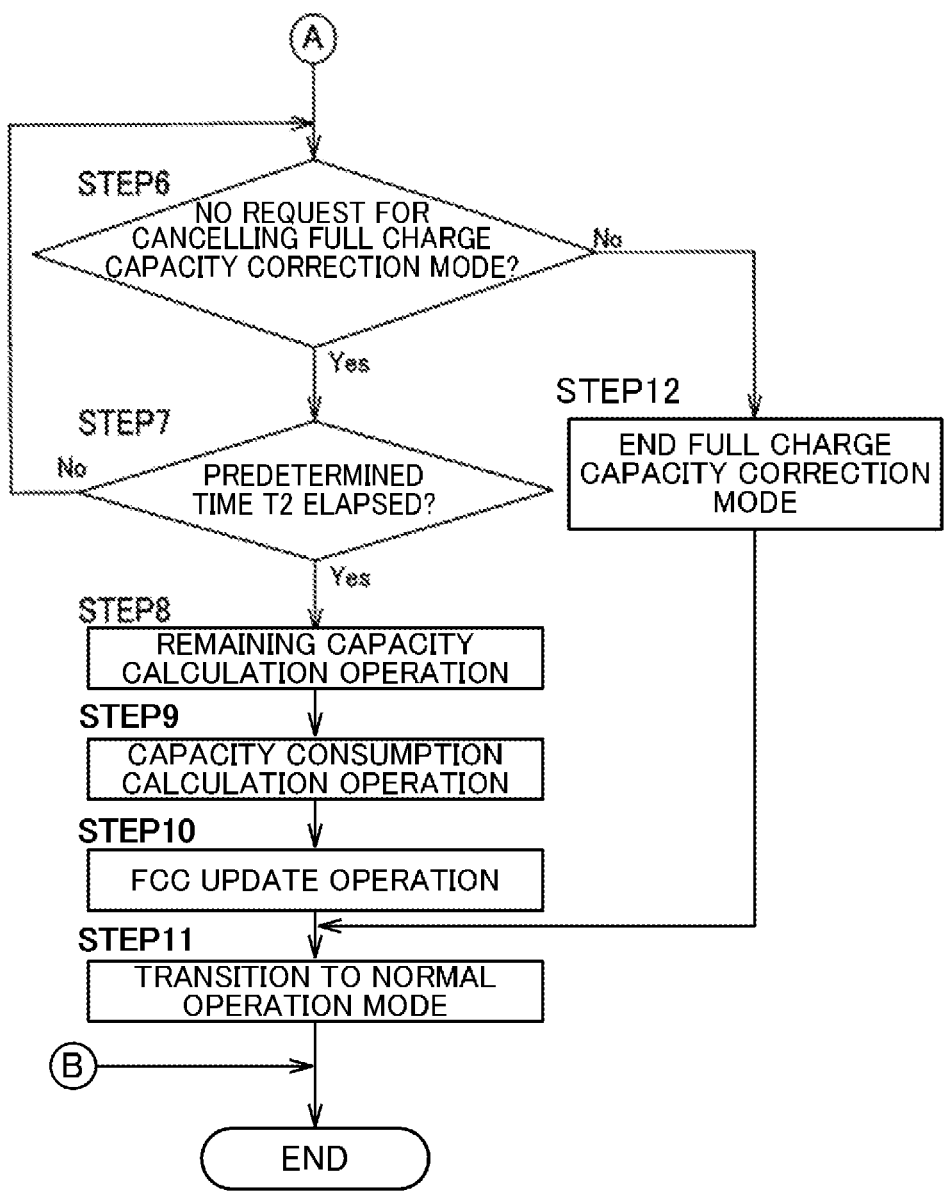
FIG. 4 is a flowchart of the full charge capacity correction mode of the power storage device.

After transition to the full charge capacity correction mode, it is checked whether or not there is no request for cancelling the full charge capacity correction mode (STEP 6) while waiting until a lapse of predetermined time T2 in a state in which there is no request for cancelling the full charge capacity correction mode (STEP 7), as in a flowchart of FIG. 4. That is, the current input/output is substantially brought into 0 A without charge/discharge operation of the secondary cell unit 10, and the processing waits until a lapse of the predetermined time T2 in a state in which the set capacity is maintained. Thus, during such a period, the power supply system cannot perform normal operation.

The predetermined time T2 is time until OCV becomes sufficiently stable, and varies depending on a cell to be used. For example, it is assumed that the predetermined time T2 is about 100 minutes to 200 minutes.

Note that in the power storage device 8 according to one or more embodiments, time T3 that the state of the current and voltage of the secondary cell unit 10 is not updated on the display device is provided after the cell capacity has reached the set capacity. That is, on the display device, the previous current/voltage state remains displayed for the time T3, and an actual current/voltage state is not displayed. The time T3 is, for example, set to about 10 seconds to 20 seconds.

When the predetermined time T2 has elapsed in a state in which there is no request for cancelling the full charge capacity correction mode and the set capacity is maintained (Yes at STEP 7), the voltage (a first voltage) of the secondary cell unit 10 and the voltage (the first voltage) of each of the secondary cell groups 20a to 20e are sensed and acquired (a cell voltage sensing step), and later-described remaining capacity calculation operation is performed (STEP 8). Subsequently to the remaining capacity calculation operation, later-described capacity consumption calculation operation is performed (STEP 9), and based on these types of operation, the FCC update operation of updating information regarding the full charge capacity is performed (STEP 10). Then, when the FCC update operation ends, transition to the normal operation mode is made (STEP 11).

At STEP 2, in a case where the predetermined period T1 is not elapsed yet after the previous full charge state (No at STEP 2), it is determined that it is not necessary to transition to the full charge capacity correction mode, and the operation remains performed in the normal operation mode.

At STEP 3, when the charge current is sensed (Yes at STEP 3), charging is performed without transition to the full charge capacity correction mode, and the operation remains performed in the normal operation mode.

At STEP 6, when there is a request for cancelling the full charge capacity correction mode (No at STEP 6), the full charge capacity correction mode ends (STEP 12), and transition to the normal operation mode is made (STEP 11).

Next, the remaining capacity calculation operation will be described.

Figure 6:
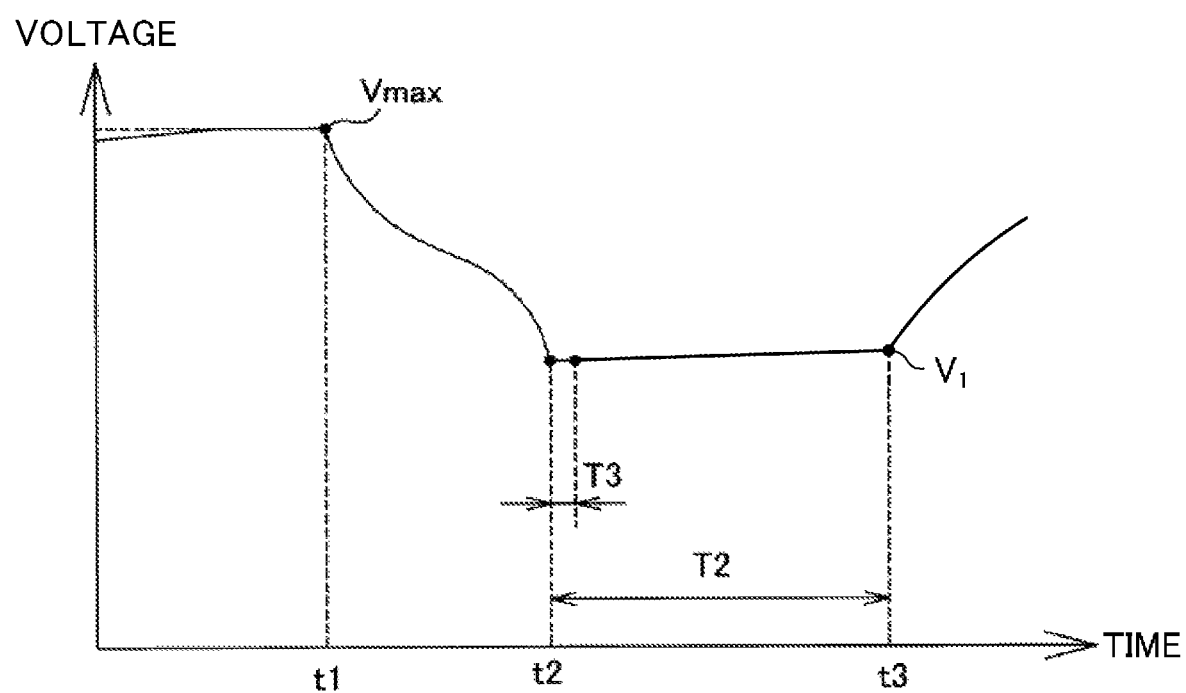
FIG. 6 is a graph showing typical voltage transition in the full charge capacity correction mode of the power storage device.

First, as illustrated in FIG. 6, after discharging has been performed from the full charge capacity to the set capacity, the open circuit voltage $V_0$ of the entirety of the secondary cell unit 10 at time t3 at which the predetermined time T2 has elapsed in a state in which the set capacity is maintained is acquired, and from the open circuit voltage $V_0$, the average voltage (the first voltage) $V_1$ of the open circuit voltages of the secondary cell groups 20a to 20e is calculated.

Figure 5:
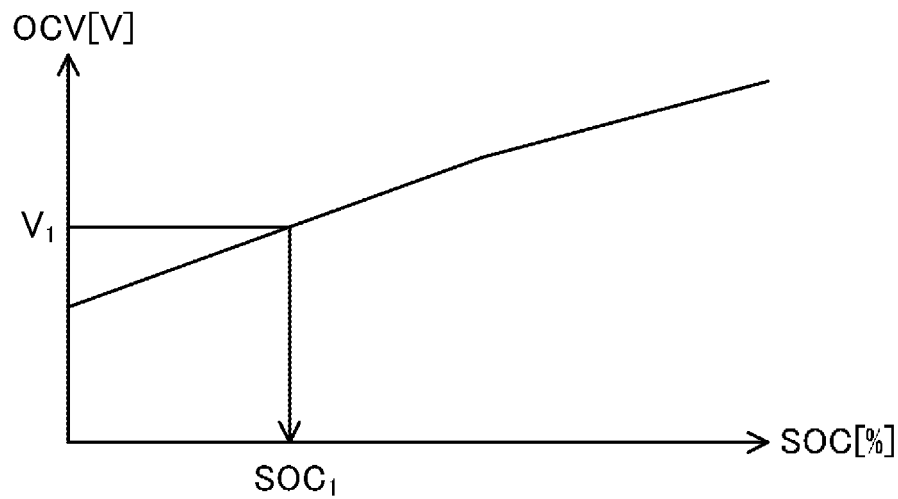
FIG. 5 is a graph for describing a correlation between a charge rate of a secondary cell forming a secondary cell unit and an open circuit potential.

Next, as illustrated in FIG. 5, a charge rate $SOC_1$ corresponding to the average voltage (the first voltage) $V_1$ is obtained using a preset correlation between the open circuit voltage (OCV) of the secondary cell forming the secondary cell unit 10 and the cell capacity (the charge rate (SOC)). Note that as the correlation (a OCV-SOC curve) between the open circuit voltage and the cell capacity as illustrated in FIG. 5, data obtained in advance for the secondary cell can be stored in a storage of the controller 15.

Thus, when discharging is performed from the full charge capacity to the set capacity, a cell capacity (the remaining capacity) RC remaining in each of the secondary cell groups 20a to 20e can be calculated by the following expression (1) by means of a full charge capacity FCC1 set initially or re-set in the previous full charge capacity correction mode.

[Expression 1]

$$RC = FCC1 \times \frac{SOC_1}{100} \quad (1)$$

Note that in a case where the correlation between the open circuit voltage (OCV) and the cell capacity (the charge rate (SOC)) as illustrated in FIG. 5 is set as a table including discrete numerical values, the charge rate $SOC_1$ corresponding to the average voltage (the first voltage) $V_1$ can be obtained using an interpolating method.

Next, the capacity consumption calculation operation will be described.

As illustrated in FIG. 6, the capacity consumption (DCR) of each of the secondary cell groups 20a to 20e until time t2 at which the capacity reaches the set capacity after time t1 at which the full charge state is brought and discharging is started can be, using the following expression (2), calculated by accumulation of a current amount from the time t1 to the time t2.

[Expression 2]

$$DCR = \int_{t1}^{t2} i \, dt \quad (2)$$

Subsequently, the FCC update operation will be described.

In the FCC update operation, the remaining capacity RC calculated by the above-described remaining capacity calculation operation and the capacity consumption DCR calculated by the capacity consumption calculation operation are, as shown in the following expression (3), summed to calculate an actual full charge capacity FCC2, thereby re-setting such a value as FCC.

[Expression 3]

$$FCC2 = RC + DCR \quad (3)$$

Subsequently, an electric connection relationship in each configuration of the power supply system 1 will be described.

The power generation device 2 is connected to the power storage device 8 through the power conversion device 7. Thus, the power storage device 8 can directly charge the DC power generated by the power generation device 2.

The power generation device 2 is electrically connected to the external load 100 by way of the power conversion device 7 and the power supply control device 3. Thus, the DC power generated by the power generation device 2 can be converted into the AC power by the power conversion device 7, and the AC power can be supplied to the external load 100.

The power storage device 8 is electrically connected to the external load 100 by way of the power conversion device 7 and the power supply control device 3. Thus, the DC power stored in the power storage device 8 can be converted into the AC power by the power conversion device 7, and the AC power can be supplied to the external load 100.

The power storage device 8 is electrically connected to the system power supply 101 by way of the power conversion device 7 and the power supply control device 3. Thus, the AC power supplied from the system power supply 101 can be converted into the DC power by the power conversion device 7, and the DC power can be stored in the power storage device 8. In other words, the power storage device 8 can be charged with the DC power converted from the AC power supplied from the system power supply 101.

According to the power storage device 8 of one or more embodiments, the full charge capacity correction mode is performed on condition that only discharging was performed from the full charge capacity to the set capacity, the current remaining capacity RC is calculated based on the voltage (the first voltage) of each of the secondary cell groups 20a to 20e at the set capacity and the preset correlation between the voltage (OCV) and the cell capacity (SOC), the capacity consumption DCR is calculated by accumulation of the current value upon discharging from the full charge state to the set capacity, and the sum of the remaining capacity RC and the capacity consumption DCR is re-set as the actual full charge capacity. That is, according to independent different criteria, each of the capacity consumption DCR and the remaining capacity RC is calculated to set the actual full charge capacity. Thus, the actual full charge capacity according to a decrease in the capacity of the secondary cell unit 10 due to deterioration of the secondary cell unit 10 can be set. Moreover, control can be performed according to the full charge capacity set according to an actual situation, and therefore, over-discharging or over-charging of each of the secondary cell groups 20a to 20e can be prevented. Thus, many secondary cells can be mounted on the power storage device 8, and the large-capacity secondary cell unit 10 can be built in the power storage device 8.

In the above-described remaining capacity calculation operation, the actual remaining capacity RC is calculated based on the first voltage $V_1$ at the set capacity and the preset correlation between the voltage (OCV) and the cell capacity (SOC). However, when an environmental temperature changes, the correlation between OCV and SOC might change in some cases. For this reason, even when the same value of the first voltage $V_1$ is applied, the value of $SOC_1$ corresponding to the first voltage $V_1$ might change depending on the timing of acquiring first voltage $V_1$ in some cases.

Figure 7:
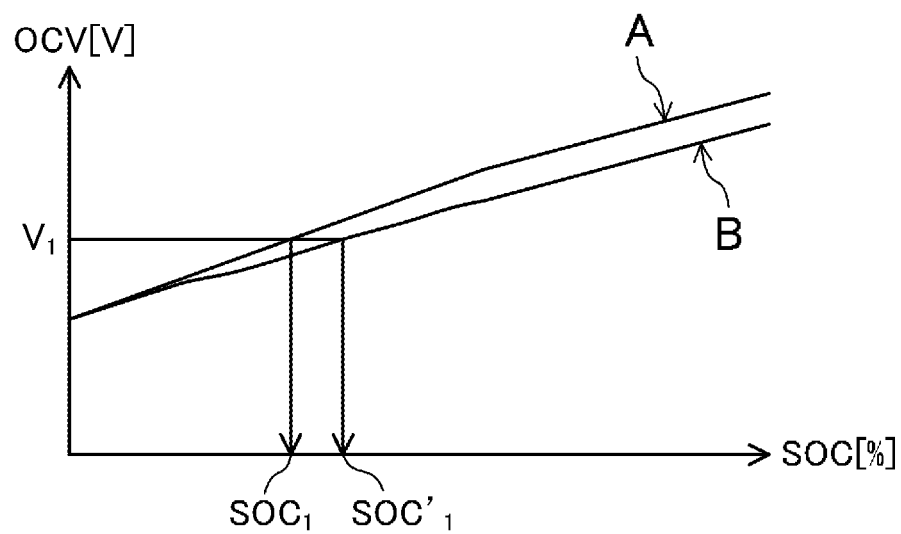
FIG. 7 is a graph for describing the correlation between the charge rate and the open circuit potential for different environmental temperatures.

FIG. 7 is a graph showing the correlation (the OCV-SOC curve) between OCV and SOC in the case of different environmental temperatures, and a curve indicated by an arrow A shows the case of a higher environmental temperature than that of a curve indicated by an arrow B.

As illustrated in FIG. 7, the same value of the first voltage $V_1$ is applied, and $SOC_1$ and $SOC'_1$ each obtained from the curve A and the curve B for the different environmental temperatures are different values. Such a difference ($\Delta SOC_1 = |SOC'_1 - SOC_1|$) varies according to the type of cell and the environmental temperature. For example, in the case of obtaining, for the same value of the first voltage $V_1$, $SOC_1$ from each of OCV-SOC curves obtained for environmental temperatures of 25° C. and −20° C., $\Delta SOC_1$ is typically a magnitude of about 3% to 5% in some cases. Thus, there is a probability that in the case of the different environmental temperatures, the precision of the actual full charge capacity obtained in the full charge capacity correction mode is degraded.

For this reason, the correlation between OCV and SOC may be set in advance as multiple correlations for the different environmental temperatures, and in the remaining capacity calculation operation, the remaining capacity may be calculated using one of the multiple correlations close to an actual environmental temperature. With this configuration, a higher-accuracy full charge capacity can be re-set.

The range of the set environmental temperature as described herein may be determined as necessary depending on environment for the secondary cell unit to be used and the specifications of the secondary cell. For example, such a range may be set at several levels within a range of −20° C. to 50° C.

Moreover, the power storage device 8 illustrated in FIG. 1 may include a sensing section (i.e., temperature sensor, not shown) configured to sense the actual environmental temperature. With this configuration, the remaining capacity calculation operation can be executed using one of the multiple correlations close to the actual environmental temperature sensed by the sensing section.

In the above-described embodiments, the case where the full charge capacity, OCV, SOC, etc. are always updated for performing the full charge capacity correction mode has been described, but the present invention is not limited to such an example.

For example, in the full charge capacity correction mode, in a case where there is almost no change in OCV as compared to previous OCV or in a case where OCV has increased as compared to previous OCV, the full charge capacity, OCV, SOC, etc. are not necessarily updated.

As an application of the above-described embodiments, a deterioration state (SOH) may be calculated based on FCC calculated based on the full charge capacity correction mode. SOH can be calculated by division of FCC by a design capacity (DC).

In the above-described embodiments, the time T3 that the state of the current and voltage of the secondary cell unit 10 is not updated on the display device is provided after the cell capacity has reached the set capacity, but the present invention is not limited to such a configuration.

A current state of the current and voltage of the secondary cell unit 10 may be constantly displayed on the display device, or is not necessarily displayed.

In the above-described embodiments, in the full charge capacity correction mode, the charge current and the discharge current for the secondary cell unit 10 are substantially limited to 0 A by a program, but the present invention is not limited to such a configuration. The secondary cell unit 10 may be electrically disconnected from the power conversion device 7 by the switch 16 such that an open circuit is formed, and in this manner, the charge current and the discharge current may be limited to 0 A.

In the above-described embodiments, the average voltage $V_1$ of the open circuit voltages of the secondary cell groups 20a to 20e is calculated from the open circuit voltage $V_0$ of the entirety of the secondary cell unit 10, and the remaining capacity RC is calculated using the average voltage $V_1$ as the first voltage. However, each of the voltages of the secondary cell groups 20a to 20e may be measured, and the remaining capacity RC may be calculated using the minimum voltage Vmin of these voltages as the first voltage.

With this configuration, charging/discharging of the secondary cell unit 10 is controlled using the full charge capacity re-set based on the secondary cell group whose decrease in the cell capacity is greatest, and therefore, occurrence of over-discharging and over-charging in a small-capacity cell can be more effectively prevented.

In the above-described embodiments, the voltages of the secondary cell groups 20a to 20e are directly sensed by the voltage sensing sections 11a to 11e, but the present invention is not limited to such a configuration. The voltage sensing sections 11a to 11e may sense information regarding the voltages of the secondary cell groups 20a to 20e, and the voltages may be indirectly sensed.

The "information regarding the voltages" as described herein is information corresponding to the voltage in one-to-one correspondence.

In the above-described embodiments, the secondary cell unit 10 includes five secondary cell groups 20a to 20e, but the present invention is not limited to such a configuration. The number of secondary cell groups 20 in the secondary cell unit 10 is not specifically limited.

In the above-described embodiments, the secondary cell group includes the multiple secondary cells, but the present invention is not limited to such a configuration. The secondary cell group 20 may be a single secondary cell.

In the above-described embodiments, discharging is, based on the power request from the external load 100, performed from the full charge capacity to the set capacity, and goes along with the situation under discharge environment. However, the present invention is not limited to such a configuration. For example, according to power supply to, e.g., the electric power company, discharging may be forcibly performed from the full charge capacity to the set capacity.

In the above-described embodiments, the cell capacity is consumed from the full charge capacity to the set capacity by monotonic discharging, but the present invention is not limited to such a configuration.

Charging may be performed between the full charge capacity and the set capacity. In this case, in the capacity consumption calculation operation, the current amount is accumulated from the time t1 at which the full charge state is brought and discharging is started to the time t2 at which the cell capacity reaches the set capacity, taking the current amount upon discharging as positive and taking the current amount upon charging as negative.

In the above-described embodiments, the voltage of the entirety of the secondary cell unit 10 and the voltage of each of the secondary cell groups 20a to 20e are used for sensing the full charge state, but the present invention is not limited to such a configuration.

The full charge state may be sensed only with the voltage of the entirety of the secondary cell unit 10, or may be sensed only with the voltage of each of the secondary cell groups 20a to 20e. Alternatively, the full charge state may be sensed by other well-known methods for sensing the full charge state.

In one or more embodiments, the full charge capacity correction mode may be executed in the case of performing only discharging from the full charge capacity to the set capacity. With this configuration, the actual full charge capacity can be set in a state in which influence of charging on a capacity change is excluded, and therefore, can be more accurately set.

Moreover, in a state in which current input/output in the cell is substantially brought into zero and the set capacity is maintained, the voltage of the cell after a lapse of the predetermined time after the cell capacity has reached the set capacity may be acquired as the first voltage. With this configuration, a pseudo open circuit voltage (hereinafter also referred to as "OCV") at the set capacity in a stable state can be acquired, and therefore, variation in a measurement value can be reduced and a correct charge capacity can be calculated.

The phrase of "current input/output in the cell is substantially brought into zero" as described herein means that the charge current to the cell and the discharge current from the cell are limited to an ignorable extent. Specifically, such a phrase means that the charge current to the cell and the discharge current from the cell are limited to equal to or lower than 0.01 C.

The value of "1 C" as described herein means a current value with which discharging ends by constant current discharging for one hour. That is, "0.01 C" is a current value with which discharging ends by constant current discharging for 100 hours.

Moreover, the full charge capacity correction mode may be repeatedly executed. With this configuration, in the case of performing only discharging in a state in which the interval of performing the full charge capacity correction mode is a predetermined period, the full charge capacity correction mode is executed, and therefore, less interferes with the normal operation.

Further, the power conversion device 7 in one or more embodiments can be electrically connected to the system power supply 101, and can convert the AC power supplied from the system power supply 101 into the DC power to charge the power storage device 8 with the DC power. With this configuration, the AC power supplied from the system power supply 101 can be converted into the DC power, and the power storage device 8 can be charged with the DC power. Thus, charging can be performed in a time period for which an electric rate is low, and the electricity stored in the power storage device 8 can be used in a time period for which the electric rate is high, for example. Thus, e.g., a user's electric bill can be reduced.

In addition, in one or more embodiments, the display device capable of acquiring the information regarding the power of the power storage device 8 to display such information is provided. Thus, a user can visually check the information regarding the power of the power storage device 8, and can grasp a current status of the power storage device 8.

In the case of maintaining the set capacity in a state in which the current input/output in the cell is substantially brought into zero, it is theoretically considered that a constant voltage is shown due to no current input/output. However, a voltage value actually increases right after only discharging has been performed to the set capacity. For this reason, the information regarding the voltage changes in association with voltage fluctuation. Thus, there is a probability that when the user views an indication of the information regarding the voltage, the user thinks that failure etc. have occurred. For this reason, in the full charge capacity correction mode, the display device may not update the information regarding the voltage of the power storage device in the predetermined period after the cell has reached the set capacity. This configuration can prevent the user from thinking that the failure etc. have occurred when viewing the display device.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Power Supply System
2 Power Generation Device
3 Power Supply Control Device
5 Power Storage System
7 Power Conversion Device
8 Power Storage Device
10 Secondary Cell Unit (Cell)
11a to 11e Voltage Sensing Section (Voltage Information Sensing Section)
12 Current Sensing Section
15 Controller
16 Switch
20a to 20e Secondary Cell Group

The invention claimed is:

1. A power storage device comprising:
a cell; and
a controller that:
  causes the cell to discharge from a full charge capacity to a set capacity that is set in advance, and
  executes a full charge capacity correction mode including a remaining capacity calculation operation and capacity consumption calculation operation, wherein
in the remaining capacity calculation operation, the controller:
  acquires a first voltage of the cell at the set capacity in response to the cell discharging from the full charge capacity to the set capacity, and
  calculates an actual remaining capacity of the cell based on the first voltage and one of a plurality of correlations between a voltage of the cell and a cell capacity,
in the capacity consumption calculation operation, the controller:
  accumulates a current value while the cell discharges from the full charge capacity to the set capacity, and
  calculates a capacity consumption from the full charge capacity to the set capacity,
in the full charge capacity correction operation, the full charge capacity is reset by a sum of the actual remaining capacity and the capacity consumption,
the plurality of correlations between the voltage of the cell and the cell capacity is set in advance for different environmental temperatures, and
the controller executes the remaining capacity calculation operation based on one of the plurality of correlations for an environmental temperature that is closest to an actual environmental temperature.

2. The power storage device according to claim 1, further comprising:
a temperature sensor that senses the actual environmental temperature, wherein
the controller executes the remaining capacity calculation operation based on one of the plurality of correlations for the environmental temperature that is closest to the actual environmental temperature sensed by the temperature sensor.

3. The power storage device according to claim 1, wherein the controller executes the full charge capacity correction operation when the cell only discharges from the full charge capacity to the set capacity.

4. The power storage device according to claim 1, wherein in the remaining capacity calculation operation, in a state in which current input/output in the cell is substantially zero, the controller acquires, as the first voltage, the voltage of the cell after a predetermined time since the cell capacity has reached the set capacity.

5. The power storage device according to claim 4, wherein the controller sets a plurality of predetermined periods of time in advance for different environmental temperatures, and
the predetermined time is one of the plurality of predetermined periods of time for an environmental temperature that is closest to the actual environmental temperature.

6. The power storage device according to claim 4, wherein the cell comprises secondary cell groups that are connected together in series,
the controller acquires a minimum voltage of the secondary cell groups after the predetermined time since the cell capacity has reached the set capacity in the state in which the current input/output in the cell is substantially zero, and
in the remaining capacity calculation operation, the controller calculates the actual remaining capacity using the minimum voltage in place of the first voltage.

7. The power storage device according to claim 1, wherein the controller repeats the full charge capacity correction mode.

8. A power storage system that electrically connects to a power generation device, comprising:
the power storage device according to claim 1; and
a power conversion device that converts power between AC power and DC power, wherein
the power generation device charges the power storage device.

9. The power storage system according to claim 8, wherein
the power conversion device is electrically connected to a system power supply,
the system power supply supplies the AC power, and
the power storage device is charged with the DC power.

10. A power supply system comprising:
the power storage device according to claim 1; and
a display device that acquires and displays information regarding power of the power storage device, wherein
the power storage device acquires the voltage of the cell as the first voltage after a predetermined time since the cell capacity has reached the set capacity, in the state in which the current input/output in the cell is substantially zero, and
in the full charge capacity correction mode, the display device remains displaying the information regarding the power of the power storage device for a predetermined period after the cell has reached the set capacity.

11. A method for controlling a power storage device comprises a built-in cell, comprising:
a remaining capacity calculation step of measuring a first voltage of the built-in cell when the built-in cell discharges from a full charge capacity to a set capacity set in advance and calculating an actual remaining capacity of the built-in cell based on the first voltage and a preset correlation between a voltage of the built-in cell and a built-in cell capacity;
a capacity consumption calculation step of accumulating a current value while the built-in cell discharges from the full charge capacity to the set capacity and calculating a capacity consumption from the full charge capacity to the set capacity; and
a full charge capacity setting step of resetting the full charge capacity with a sum of the actual remaining capacity and the capacity consumption, wherein
a plurality of correlations between the voltage of the built-in cell and the built-in cell capacity is set in advance for different environmental temperatures, and
at the remaining capacity calculation step, the actual remaining capacity of the built-in cell is calculated based on one of the plurality of correlations for an environmental temperature that is closest to an actual environmental temperature.

* * * * *